US010425065B2

(12) United States Patent
Xu et al.

(10) Patent No.: US 10,425,065 B2
(45) Date of Patent: Sep. 24, 2019

(54) HIGH-SPEED LOW-POWER-CONSUMPTION TRIGGER

(71) Applicant: No. 24 Research Institute of China Electronics Technology Group Corporation, Chongqing (CN)

(72) Inventors: Daiguo Xu, Chongqing (CN); Gangyi Hu, Chongqing (CN); Ruzhang Li, Chongqing (CN); Jianan Wang, Chongqing (CN); Guangbing Chen, Chongqing (CN); Yuxin Wang, Chongqing (CN); Dongbing Fu, Chongqing (CN); Tao Liu, Chongqing (CN); Lu Liu, Chongqing (CN); Minming Deng, Chongqing (CN); Hanfu Shi, Chongqing (CN); Xu Wang, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 16/064,658

(22) PCT Filed: Jan. 19, 2017

(86) PCT No.: PCT/CN2017/071645

§ 371 (c)(1),
(2) Date: Oct. 15, 2018

(87) PCT Pub. No.: WO2017/133466

PCT Pub. Date: Aug. 10, 2017

(65) Prior Publication Data

US 2019/0115903 A1 Apr. 18, 2019

(30) Foreign Application Priority Data

Feb. 3, 2016 (CN) ........................ 2016 1 00761035

(51) Int. Cl.

| | |
|---|---|
| ***H03K 19/00*** | (2006.01) |
| ***H03K 3/012*** | (2006.01) |
| ***H03K 3/037*** | (2006.01) |

(52) U.S. Cl.

CPC ............ *H03K 3/012* (2013.01); *H03K 3/037* (2013.01); *H03K 19/0013* (2013.01); *H03K 19/0016* (2013.01)

(58) Field of Classification Search

CPC ............ H03K 3/00; H03K 3/01; H03K 3/012; H03K 3/027; H03K 3/037; H03K 19/00;

(Continued)

(56) References Cited

U.S. PATENT DOCUMENTS

| | | | | |
|---|---|---|---|---|
| 6,232,810 | B1 * | 5/2001 | Oklobdzija ............ | H03K 3/012 327/217 |
| 7,852,118 | B2 * | 12/2010 | Deutscher .......... | H03K 19/0016 326/68 |
| 8,558,595 | B2 * | 10/2013 | Teh .......................... | H03K 3/36 327/212 |
| 9,531,352 | B1 * | 12/2016 | Aw .................. | H03K 3/356113 |

(Continued)

FOREIGN PATENT DOCUMENTS

| | | | |
|---|---|---|---|
| CN | 1702962 | A | 11/2005 |
| CN | 105162441 | A | 12/2015 |
| CN | 105763172 | A | 7/2016 |

OTHER PUBLICATIONS

Li, X. et al., "Self-blocking flip-flop design", Electronics Letters, vol. 48, No. 2,19 1-5 Jan. 2012 (Jan. 19, 2012), ISSN: 00I3-5194, p. I, right column, paragraph 5, and figure 3.

*Primary Examiner* — Jason Crawford

(74) *Attorney, Agent, or Firm* — Global IP Services; Tianhua Gu

(57) ABSTRACT

A high-speed low-power-consumption trigger, which comprises a control signal generation circuit, an enabling unit, and a latch structure. The latch structure comprises two input ends, two output ends, two enabling ends, a second enabling end, and a ground end. The enabling unit comprises two (Continued)

vdd, D, M102, M112, DB, M82, CLK, X, M132, M123, M83, M92, Q, QB, AND1, M42, M52, M62, M72, AND2, M32 enabling circuits. An output signal X of the control signal generation circuit and an external control signal D serve as input signals of the first enabling circuit. An output end of the first enabling circuit is connected to the first enabling end. The output signal X of the control signal generation circuit and a phase-inverted signal DB of the external control signal D serve as input signals of the second enabling circuit. An output end of the second enabling circuit is connected to the second enabling end.

5 Claims, 4 Drawing Sheets

(58) Field of Classification Search
CPC ........... H03K 19/0008; H03K 19/0013; H03K 19/0016
See application file for complete search history.

(56) References Cited

U.S. PATENT DOCUMENTS

2002/0047737 A1* 4/2002 Park ...................... H03K 3/012 327/211
2004/0061531 A1 4/2004 Yoo
2004/0196082 A1* 10/2004 Pacha .................... H03K 3/012 327/215
2006/0221723 A1* 10/2006 Kang ..................... H03K 3/012 365/189.05
2007/0024337 A1* 2/2007 Teh ........................ H03K 3/012 327/172
2012/0182056 A1* 7/2012 Dally ..................... H03K 3/012 327/202
2012/0206182 A1* 8/2012 Dally ..................... H03K 3/012 327/215
2013/0113522 A1* 5/2013 Chang .................... H03K 19/20 326/62

* cited by examiner

| Structure of A Flip-flop | Delay Time (ps) of Q Relative to CLK | | Power Consumption (μW) |
|---|---|---|---|
| | Rising edge | Falling edge | |
| SAFF | 34.4 | 47.5 | 3.879 |
| MSAFF | 32.1 | 34.2 | 4.325 |
| SBFF | 31.6 | 25.3 | 3.854 |
| The present invention | 22.3 | 21.1 | 3.892 |

HIGH-SPEED LOW-POWER-CONSUMPTION TRIGGER

CROSS REFERENCE TO RELATED PATENT APPLICATION

The present application is the US national stage of PCT/CN2017/071645 filed on Jan. 19, 2017, which claims the priority of the Chinese patent application No. CN2016100761035 filed on Feb. 3, 2016, which application is incorporated herein by reference.

BACKGROUND OF THE PRESENT INVENTION

Field of Invention

The present invention belongs to the technical field of analog or digital-to-analog hybrid integrated circuit, and relates to a high-speed low-power-consumption trigger.

Description of Related Arts

A trigger, as an important sequential circuit structure, is widely applied to digital, analog and analog-to-digital hybrid integrated circuit. In recent years, with the continuous development of the manufacturing technology of the integrated circuit, the demand for a high-speed low-power-consumption trigger is gradually increasing. In order to adapt to the requirement of low-power, the supply voltage further reduces. Against to this trend, in order to ensure the operating performance of the trigger, some high-speed low-power-consumption trigger structures have been developed, including a SAFF (sense amplifier based trigger) structure, a MSAFF (modified sense amplifier based trigger) structure and a SBFF (self-blocking trigger) structure. The foregoing three structures have respective advantages and disadvantages thereof, but the foregoing three structures are quite difficult to simultaneously meet features: a simple structure, and an implementation of the high-speed low-power-consumption trigger.

To describe the foregoing problem in more details, operating principles and advantages and disadvantages of the foregoing three triggers are analyzed first.

FIG. 1 shows a trigger of SAFF structure. The trigger of SAFF structure comprises latches of two stages. A first-stage latch comprises NMOS transistors M0 to M3 and PMOS transistors M4 to M9, wherein a source electrode of M0 is grounded, a drain electrode of M0 is connected to source electrodes of M1 and M2, a gate electrode of M0 is connected to a clock signal CLK, a gate electrode of M3 is connected to a power source vdd, a source electrode and a drain electrode of M3 are connected to drain electrodes of M1 and M2, at the same time, the drain electrodes of M1 and M2 are connected to source electrodes of M4 and M5, gate electrodes of M1 and M2 are connected to an input signal D and a phase-inverted signal DB thereof, the transistor M3 is open all the time, and serves as a resistor to prevent a heavy voltage fluctuation from being generated at two ends of the transistor M3, M4/M5/M6/M7 constitute an input/output connected latch structure, M8 and M9 serve as enabling transistors and connect the power source vdd and output of the first-stage latch, and gate electrodes of M8 and M9 are connected to the clock signal CLK. A second-stage latch comprises NMOS transistors M10 to M13 and PMOS transistors M14 to M17, wherein source electrodes of M10 and M11 are grounded, drain electrodes of M10 and M11 are connected to source electrodes of M12 and M13 respectively, gate electrodes of M10 and M11 are connected to output signals SB and RB of the first-stage latch respectively, M12/M13/M14/M17 constitute an input/output connected latch structure, M15 and M16 serve as enabling transistors and connect the power source vdd and output of the second-stage latch, and gate electrodes of M15 and M16 are connected to the output SB and RB of the first-stage latch. When the clock signal CLK is a low electrical level, M0 is turned off, M8 and M9 are turned on, the first-stage latch is in a reset state, the output SB and RB of the first-stage latch are both high electrical levels, the second-stage latch is in a latching state, and output Q and QB of the second-stage latch maintain values in last state. When the clock signal CLK changes from the low electrical level to a high electrical level, M0 is turned on, M8 and M9 are turned off, the first-stage latch is flipped based on the input signal D and the phase-inverted signal DB thereof, one of the output signals SB and RB is a high electrical level, and the other is a low electrical level, and the output Q and QB of the second-stage latch are refreshed once. FIG. 2 is a diagram of an operating sequence of the trigger of SAFF structure. A delay time td1 between a rising edge of the clock CLK and data refreshing is a delay time of the trigger in FIG. 1, and the delay time is a sum of delay times of the two stages of latches. An advantage of FIG. 1 is that each stage of latch structure is relatively simple so that circuit design is quite easy to be implemented, but a disadvantage is that the two-stage latch structure is relatively slow, and the second-stage latch is also relatively slow.

FIG. 3 shows a trigger of MSAFF structure, as shown in FIG. 3, the trigger of SAFF structure comprises latches of two stages. A principle diagram of a first-stage latch thereof is the same as FIG. 1, and an operating principle thereof is also the same as that in FIG. 1. A second-stage latch comprises phase inverters I1 and I2, NMOS transistors M10/M11/M12/M16/M17/M18 and PMOS transistors M13/M14/M15/M19/M20/M21. The output SB/RB of the first-stage latch serve as input signals of the second-stage latch, input ends of the phase inverters I1 and I2 are connected to RB and SB respectively, output ends of the phase inverters I1 and I2 are connected to gate electrodes of M10 and M17, source electrodes of M10 and M17 are grounded, drain electrodes of M10 and M17 are connected to drain electrodes of M14 and M21 respectively, and connected to drain electrodes of M13/M12 and gate electrodes of M16/M20, and drain electrodes of M18/M19 and gate electrodes of M11/M15, source electrodes of M11 and M16 are grounded, drain electrodes of M11 and M16 are connected to source electrodes of M12 and M18, source electrodes of M15 and M20 are connected to a power source vdd, drain electrodes of M15 and M20 are connected to drain electrodes of M13 and M19, gate electrodes of M12 and M14 are connected to SB, gate electrodes of M18 and M21 are connected to RB, a gate electrode of M13 are connected to R, and a gate electrode of M19 are connected to S. When a clock signal CLK is a low electrical level, M0 is turned off, M8 and M9 are turned on, the first-stage latch is in a reset state, the output signals SB and RB of the first-stage latch are both high electrical levels, in the second-stage latch, M10/M17/M14/M21 are turned off, M12/M13/M18/M19 are turned on, and the second-stage latch is in a latching state. When the clock signal CLK changes from the low electrical level to a high electrical level, M0 is turned on, M8 and M9 are turned off, the first-stage latch is flipped based on an input signal D and DB, one of the output signals SB and RB is a high electrical level, and the other is a low electrical level, and the output Q and QB of the second-stage latch are refreshed once. FIG. 4 is a diagram of an operating sequence of the trigger of MSAFF structure. A delay time td2 between a rising edge of the clock CLK and data refreshing is a delay time of the trigger in FIG. 2, and the delay time is also a sum of delay times of the two stages of latches. Compared with FIG. 1, the second-stage trigger in FIG. 2 additionally comprises a pulling up/down path comprising M10, M14, M17, and M21, so that the second-stage latch in FIG. 2 is faster than the second-stage latch of structure [1]. An advantage of FIG. 2 is that the speed of the second-stage latch is relatively fast, but the structure is relatively complex and power consumption is relatively large, and the two-stage latch structure is relatively slow.

FIG. 5 shows a trigger of SBFF structure, as shown in FIG. 5, the trigger of SBFF structure comprises a control signal generation circuit and a latch of one stage, wherein NMOS transistors M0 to M4 and PMOS transistor M5 constitute the control signal generation circuit, NMOS transistors M6 to M11 and PMOS transistors M12 to M16 constitute the latch. A source electrode of M0 is grounded, a drain electrode of M0 is connected to source electrodes of M1 and M2, drain electrodes of M1 and M2 are connected to source electrodes of M3 and M4 respectively, drain electrodes of M3 and M4 are connected to a drain electrode of M5, a source electrode of M5 is connected to a power source vdd, gate electrodes of M0 and M5 are connected to a clock signal CLK, a gate electrode of M1 is connected to an output signal Q, a gate electrode of M3 is connected to an input signal D, a gate electrode of M2 is connected to a phase-inverted signal QB of the output signal Q, and a gate electrode of M4 is connected to a phase-inverted signal DB of the input signal D. In the latch, a source electrode of M10 is grounded, a drain electrode of M10 is connected to a source electrode of M11, a drain electrode of M11 is connected to source electrodes of M7 and M8, and serves as an output end of the trigger, M6/M9/M12/M13 constitute an input/output connected latch structure, output of M6/M9/M12/M13 also serves as output ends of the latch, a gate electrode of M16 is grounded, drain electrodes of M12 and M13 are connected to two ends of M16, and are connected to drain electrodes of M14 and M15, source electrodes of M14 and M15 are connected to the power source vdd, gate electrodes of M10 and M11 are connected to a control signal X and the clock signal CLK respectively, gate electrodes of M8 and M14 are connected to the input signal D, gate electrodes of M7 and M15 are connected to the phase-inverted signal DB of the input signal D. When the clock signal CLK is a low electrical level, the control signal X is a high electrical level, and the latch is in a latching state. When the clock signal CLK changes from the low electrical level to a high electrical level, and if the input signal D in this state and the output signal Q in last state are both high electrical levels or both low electrical levels, the control signal X becomes a low electrical level, and the latch still maintains the last state. A sequence diagram thereof is shown in FIG. 6(*a*), otherwise the control signal X maintains the high electrical level. In the latch, M10 and M11 are simultaneously turned on, the output signal Q of the latch is flipped, and a sequence diagram thereof is shown in FIG. 6(*b*). An advantage of FIG. 5 is that the structure of the trigger comprises a control signal generation circuit and a latch of one stage, and the trigger additionally comprises a pulling down path comprising M7 and M8. Therefore, the speed of the trigger is increased compared with structures in FIG. 1 and FIG. 3. However, the control signal generation circuit and an enabling transistor of the latch are formed by NMOS transistors connected in series, on-resistance is relatively large, parasitic capacitance at an output end of the trigger is also relatively large, and therefore, the trigger is not applicable to design for a high-speed circuit.

SUMMARY OF THE PRESENT INVENTION

In view of this, the present invention proposes a high-speed low-power-consumption trigger. The structure comprises a control signal generation circuit and a latch of one stage without increasing design costs. The structure decreases parasitic capacitance at an output end, thereby achieving a design objective of high-speed low-power-consumption trigger.

In order to accomplish the object described above, the present invention provides the following technical solution: A high-speed low-power-consumption trigger, comprising a control signal generation circuit, an enabling unit, and a latch structure, wherein the latch structure comprises a first input end, a second input end, a first output end, a second output end, a first enabling end, a second enabling end, and a ground end, the enabling unit comprises a first enabling circuit and a second enabling circuit, an output signal X of the control signal generation circuit and an external control signal D serve as input signals of the first enabling circuit, an output end of the first enabling circuit is connected to the first enabling end, the output signal X of the control signal generation circuit and a phase-inverted signal DB of the external control signal D serve as input signals of the second enabling circuit, and an output end of the second enabling circuit is connected to the second enabling end; and the external control signal D serves as an input signal of the first input end, and the phase-inverted signal DB of the external control signal D serves as an input signal of the second input end.

Further, the control signal generation circuit is a phase inverter, an input signal of the phase inverter is a clock signal CLK, and an output signal of the phase inverter is X.

Further, the phase inverter comprises an NMOS transistor M132 and a PMOS transistor M22, a source electrode of the PMOS transistor M22 is connected to a power source, a drain electrode of the PMOS transistor M22 is connected to a drain electrode of the NMOS transistor M132, a source electrode of the NMOS transistor M132 is grounded, a gate electrode of the NMOS transistor M132 is connected to a gate electrode of the PMOS transistor M22 and is connected to the clock signal CLK, and the drain electrode of the NMOS transistor M132 and electrodes of the PMOS transistor M22 serve as output ends of the control signal generation circuit and generate the output signal X.

Further, the latch structure comprises NMOS transistors M32 to M72 and PMOS transistors M82 to M122, a source electrode of the PMOS transistor M102 and a source electrode of the PMOS transistor M112 are connected to the power source, a drain electrode of the PMOS transistor M102 is connected to a source electrode of the PMOS transistor M82 and a source electrode of the PMOS transistor M122 respectively, a drain electrode of the PMOS transistor M112 is connected to a source electrode of a PMOS transistor M192 and a drain electrode of the PMOS transistor M122 respectively, a gate electrode of the PMOS transistor M122 is grounded; a drain electrode of the PMOS transistor M82 is connected to a drain electrode of the NMOS transistor M52, a drain electrode of the NMOS transistor M42, a gate electrode of the PMOS transistor M92, and a gate electrode of the NMOS transistor M62; a drain electrode of the PMOS transistor M92 is connected to a drain electrode of the NMOS transistor M62, a drain electrode of the NMOS transistor M72, a gate electrode of the PMOS transistor M82, and a gate electrode of the NMOS transistor M52; a gate electrode of the NMOS transistor M42 serves as the first enabling end, a gate electrode of the NMOS transistor M72 serves as the second enabling end, a source electrode of the NMOS transistor M42 and a source electrode of the NMOS transistor M72 are connected to a drain electrode of the NMOS transistor M32 respectively, a source electrode of the NMOS transistor M32 is grounded, and a gate electrode of the NMOS transistor M32 is connected to the clock signal CLK; the drain electrode of the NMOS transistor M52 and the drain electrode of the NMOS transistor M62 are grounded; and the drain electrode of the NMOS transistor M42 serves as the first output end of the trigger and generates an output signal QB, and the drain electrode of the NMOS transistor M72 serves as the second output end of the trigger and generates an output signal Q.

Further, the first enabling circuit comprises an AND gate AND1, an output end of the AND gate AND1 is connected to the gate electrode of the NMOS transistor M42, the second enabling circuit comprises an AND gate AND2, and an output end of the AND gate AND2 is connected to the gate electrode of the NMOS transistor M72.

By using the foregoing technical solutions, the present invention has the following beneficial technical effects.

The present invention provides a control signal generation circuit of a trigger. An aspect ratio of an NMOS transistor M1 may be adjusted to adjust a delay time between a falling edge of the control signal X and a rising edge of the clock CLK, and the time is a latching time of the latch. The aspect ratio of M1 may be designed based on different actual applications. Compared with a conventional control signal generation circuit, the control signal generation circuit in the present invention does not need to be implemented by using a serial structure of MOS transistors, thereby improving the speed of the control signal generation circuit.

The present invention provides a latch structure, an enabling transistor of the structure comprises an NMOS transistor grounded, and the control signal X is used to enable the input signal, avoiding a conventional structure in which two NMOS transistors connected in series to the ground serve as enabling transistors, thereby improving the speed of the latch, and the structure has no static power consumption.

The present invention provides a trigger circuit comprising the foregoing control signal generation circuit and the latch. Compared with a conventional structure, the structure of the trigger in the present invention has a simple circuit structure, and parasitic capacitance at an output end of the latch is quite small, thereby improving the speed of the trigger without static power consumption.

BRIEF DESCRIPTION OF THE DRAWINGS

To make the objectives, technical solutions and advantages of the present invention clearer, the following further describes the present invention in detail with reference to accompanying drawings.

DETAILED DESCRIPTION OF THE PREFERRED EMBODIMENTS

The preferred embodiments of the present invention will be described below in detail with reference to the drawings in embodiments of the present invention. It should be understood that the preferred embodiments are only for describing the present invention, but not for limiting the protection scope of the present invention.

Figure 1:
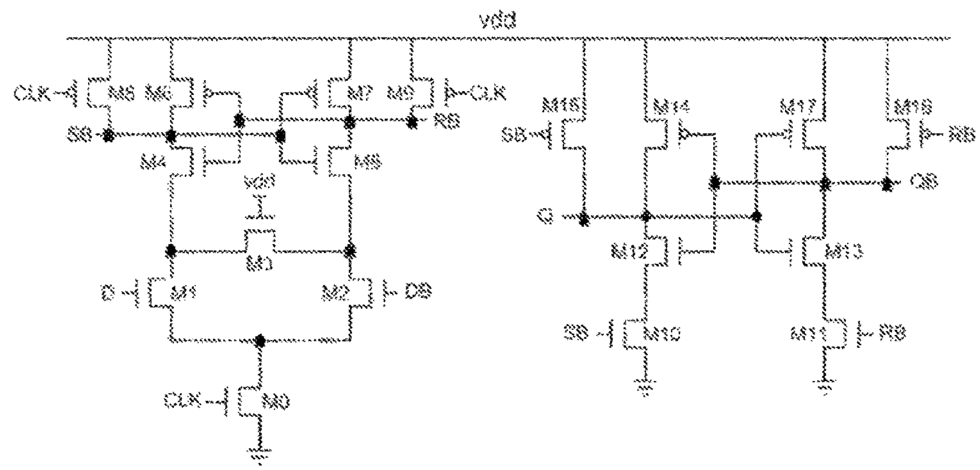
FIG. 1 is a schematic diagram of a SAFF structure.
Figure 2:
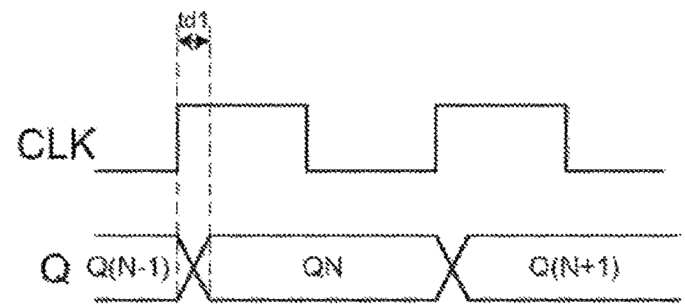
FIG. 2 is a sequence diagram of a SAFF structure.
Figure 3:
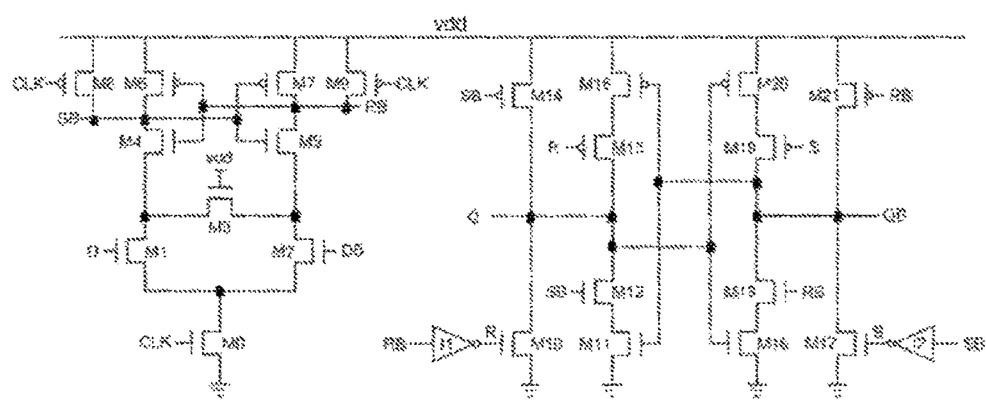
FIG. 3 is a schematic diagram of a MSAFF structure.
Figure 4:
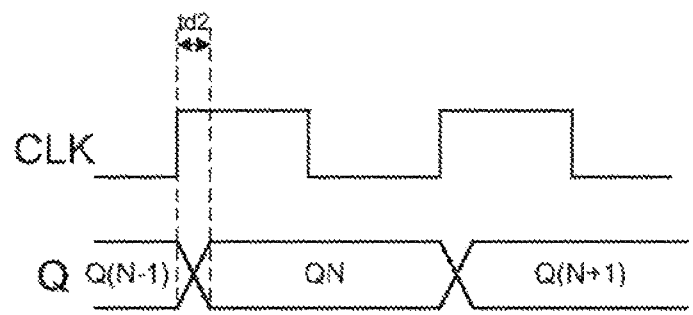
FIG. 4 is a sequence diagram of a MSAFF structure.
Figure 5:
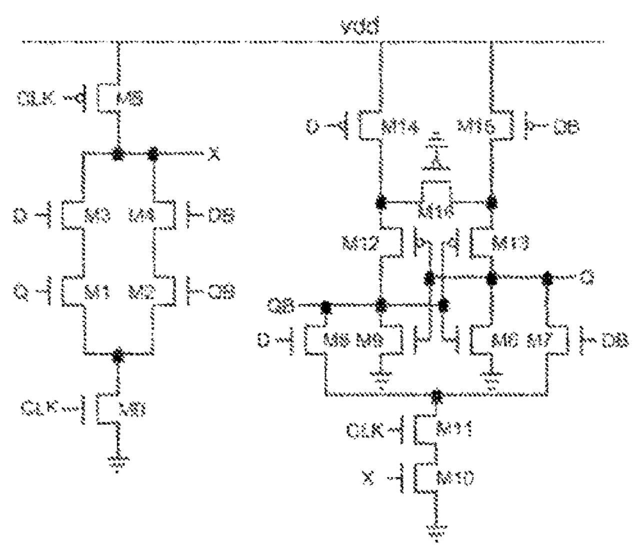
FIG. 5 is a schematic diagram of a SBFF structure.
Figure 6:
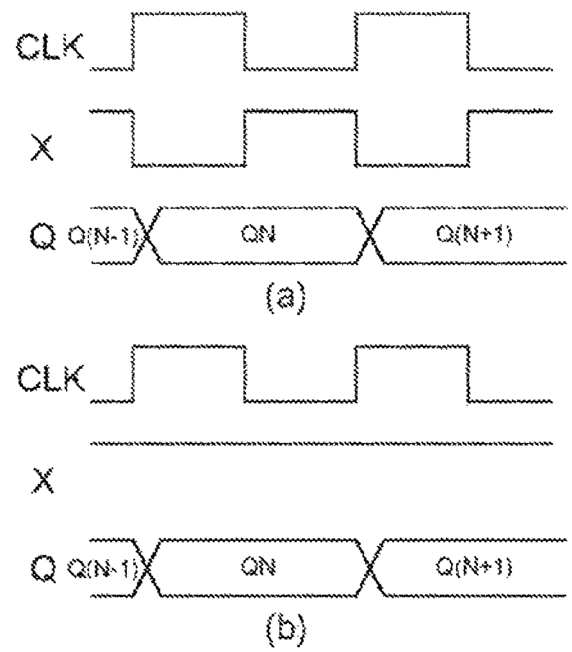
FIG. 6 is a sequence diagram of a SBFF structure.
Figure 7:
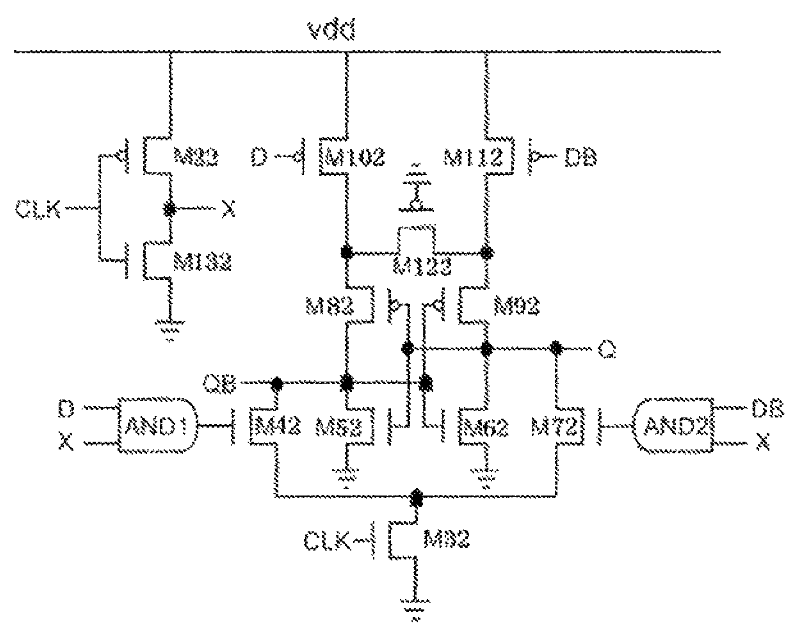
FIG. 7 is a schematic diagram of a high-speed low-power-consumption trigger of the present invention.

FIG. 7 is a schematic diagram of a high-speed low-power-consumption trigger according to the present invention. A high-speed low-power-consumption trigger comprises a control signal generation circuit, an enabling unit, and a latch structure, wherein the latch structure comprises a first input end, a second input end, a first output end, a second output end, a first enabling end, a second enabling end, and a ground end, the enabling unit comprises a first enabling circuit and a second enabling circuit, an output signal X of the control signal generation circuit and an external control signal D serve as input signals of the first enabling circuit, an output end of the first enabling circuit is connected to the first enabling end, the output signal X of the control signal generation circuit and a phase-inverted signal DB of the external control signal D serve as input signals of the second enabling circuit, an output end of the second enabling circuit is connected to the second enabling end; and the external control signal D serves as an input signal of the first input end, and the phase-inverted signal DB of the external control signal D serves as an input signal of the second input end.

The control signal generation circuit is a phase inverter, an input signal of the phase inverter is a clock signal CLK, and an output signal of the phase inverter is X. The phase inverter comprises an NMOS transistor M132 and a PMOS transistor M22, a source electrode of the PMOS transistor M22 is connected to a power source, a drain electrode of the PMOS transistor M22 is connected to a drain electrode of the NMOS transistor M132, a source electrode of the NMOS transistor M132 is grounded, a gate electrode of the NMOS transistor M132 is connected to a gate electrode of the PMOS transistor M22 and is connected to the clock signal CLK, and the drain electrode of the NMOS transistor M132 and electrodes of the PMOS transistor M22 serve as output ends of the control signal generation circuit and generate the output signal X.

The latch structure comprises NMOS transistors M32 to M72 and PMOS transistors M82 to M122, a source electrode of the PMOS transistor M102 and a source electrode of the PMOS transistor M112 are connected to the power source, a drain electrode of the PMOS transistor M102 is connected to a source electrode of the PMOS transistor M82 and a source electrode of the PMOS transistor M122 respectively, a drain electrode of the PMOS transistor M112 is connected to a source electrode of a PMOS transistor M192 and a drain electrode of the PMOS transistor M122 respectively, a gate electrode of the PMOS transistor M122 is grounded; a drain electrode of the PMOS transistor M82 is connected to a drain electrode of the NMOS transistor M52, a drain electrode of the NMOS transistor M42, a gate electrode of the PMOS transistor M92, and a gate electrode of the NMOS transistor M62 respectively; a drain electrode of the PMOS transistor M92 is connected to a drain electrode of the NMOS transistor M62, a drain electrode of the NMOS transistor M72, a gate electrode of the PMOS transistor M82, and a gate electrode of the NMOS transistor M52 respectively; a gate electrode of the NMOS transistor M42 serves as the first enabling end, a gate electrode of the NMOS transistor M72 serves as the second enabling end, a source electrode of the NMOS transistor M42 and a source electrode of the NMOS transistor M72 are connected to a drain electrode of the NMOS transistor M32 respectively, a source electrode of the NMOS transistor M32 is grounded, and a gate electrode of the NMOS transistor M32 is connected to the clock signal CLK; the drain electrode of the NMOS transistor M52 and the drain electrode of the NMOS transistor M62 are grounded; and the drain electrode of the NMOS transistor M42 serves as the first output end of the trigger and generates an output signal QB, and the drain electrode of the NMOS transistor M72 serves as the second output end of the trigger and generates an output signal Q.

The first enabling circuit comprises an AND gate AND1, an output end of the AND gate AND1 is connected to the gate electrode of the NMOS transistor M42, the second enabling circuit comprises an AND gate AND2, and an output end of the AND gate AND2 is connected to the gate electrode of the NMOS transistor M72.

Figures 8, 9:
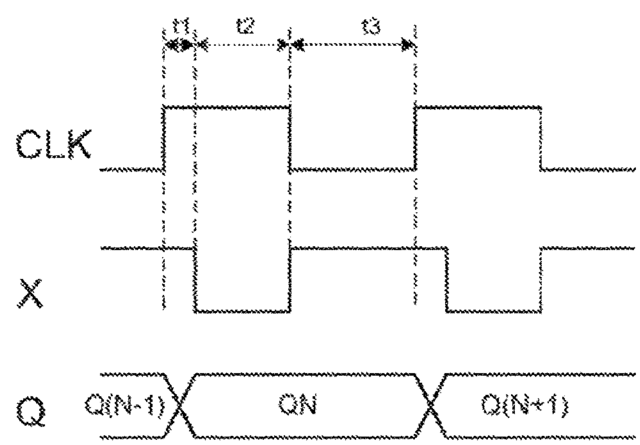
FIG. 8 is a sequence diagram of a high-speed low-power-consumption trigger of the present invention.
FIG. 9 is a diagram of performance comparison among four structures.

In the structure of the phase inverter comprised by M132 and M22, an aspect ratio of M132 is adjusted to design a delay of a falling edge of the output signal X relative to a rising edge of the clock signal CLK. An aspect ratio of the transistor M22 is designed to be relatively large, and it may be approximately considered that a rising edge of the output signal X has no delay relative to a falling edge of the clock signal CLK. Based on the foregoing analysis, the signal X can maintain a high electrical level for a short time after the clock signal CLK changes from a low electrical level to a high electrical level, in this short time, signals D and DB respectively pass AND gates AND1 and AND2, at the same time, because CLK is the high electrical level, M32 is turned on, and the latch is triggered and quickly latches the signal, subsequently, the signal X changes from the high electrical level to the low electrical level, the AND gates AND1 and AND2 output low electrical levels, M42 and M72 are turned off, and the whole trigger maintains a latching state till the clock signal CLK changes to the high electrical level next time. A sequence diagram of the trigger is shown in FIG. 8, there exists a delay time t1 between the rising edge of the clock signal CLK and the falling edge of the control signal X, in this period of time, the latch quickly latches output signals Q and QB based on the input signal D and the phase-inverted signal DB thereof. After the control signal X changes from the high electrical level to the low electrical level, although M32 is still turned on, the AND gates AND1 and AND2 both output the low electrical levels so that M42 and M72 are turned off. Therefore, in a time period of t2, the whole trigger has no static power consumption. After the clock signal CLK changes to the low electrical level, the control signal X changes to the high electrical level, M32 is turned off, and the AND gates AND1 and AND2 respectively output the input signal D and the phase-inverted signal DB of D. M32 is turned off, and therefore in a time period of t3, the whole trigger is still in the latching state and also has no static power consumption.

The above description is only the preferred embodiments of the present invention, and it is not to limit the present invention. Obviously, those skilled in the art can make various modifications and variations to the embodiments of the present invention without departing from the spirit and scope thereof. In this way, if these modifications and variations to the present disclosure are within the scope of the claims of the present invention and equivalent technologies thereof, the present invention also intends to encompass these modifications and variations.

What is claimed is:

1. A high-speed low-power-consumption trigger, comprising a control signal generation circuit, an enabling unit, and a latch structure, wherein the latch structure comprises a first input end, a second input end, a first output end, a second output end, a first enabling end, a second enabling end, and a ground end, the enabling unit comprises a first enabling circuit and a second enabling circuit, an output signal X of the control signal generation circuit and an external control signal D serve as input signals of the first enabling circuit, an output end of the first enabling circuit is connected to the first enabling end, the output signal X of the control signal generation circuit and a phase-inverted signal DB of the external control signal D serve as input signals of the second enabling circuit, and an output end of the second enabling circuit is connected to the second enabling end; and the external control signal D serves as an input signal of the first input end, and the phase-inverted signal DB of the external control signal D serves as an input signal of the second input end.

2. The high-speed low-power-consumption trigger as in claim 1, wherein the control signal generation circuit is a phase inverter, an input signal of the phase inverter is a clock signal CLK, and an output signal of the phase inverter is X.

3. The high-speed low-power-consumption trigger as in claim 2, wherein the phase inverter comprises an NMOS transistor M132 and a PMOS transistor M22, a source electrode of the PMOS transistor M22 is connected to a power source, a drain electrode of the PMOS transistor M22 is connected to a drain electrode of the NMOS transistor M132, a source electrode of the NMOS transistor M132 is grounded, a gate electrode of the NMOS transistor M132 is connected to a gate electrode of the PMOS transistor M22 and is connected to the clock signal CLK, and the drain electrode of the NMOS transistor M132 and electrodes of the PMOS transistor M22 serve as output ends of the control signal generation circuit and generate the output signal X.

4. The high-speed low-power-consumption trigger as in claim 3, wherein the latch structure comprises NMOS transistors M32 to M72 and PMOS transistors M82 to M122, a source electrode of the PMOS transistor M102 and a source electrode of the PMOS transistor M112 are connected to the power source, a drain electrode of the PMOS transistor M102 is connected to a source electrode of the PMOS transistor M82 and a source electrode of the PMOS transistor M122 respectively, a drain electrode of the PMOS transistor M112 is connected to a source electrode of a PMOS transistor M192 and a drain electrode of the PMOS transistor M122 respectively, a gate electrode of the PMOS transistor M122 is grounded; a drain electrode of the PMOS transistor M82 is connected to a drain electrode of the NMOS transistor M52, a drain electrode of the NMOS transistor M42, a gate electrode of the PMOS transistor M92, and a gate electrode of the NMOS transistor M62 respectively; a drain electrode of the PMOS transistor M92 is connected to a drain electrode of the NMOS transistor M62, a drain electrode of the NMOS transistor M72, a gate electrode of the PMOS transistor M82, and a gate electrode of the NMOS transistor M52 respectively; a gate electrode of the NMOS transistor M42 serves as the first enabling end, a gate electrode of the NMOS transistor M72 serves as the second enabling end, a source electrode of the NMOS transistor M42 and a source electrode of the NMOS transistor M72 are connected to a drain electrode of the NMOS transistor M32 respectively, a source electrode of the NMOS transistor M32 is grounded, and a gate electrode of the NMOS transistor M32 is connected to the clock signal CLK; the drain electrode of the NMOS transistor M52 and the drain electrode of the NMOS transistor M62 are grounded; and the drain electrode of the NMOS transistor M42 serves as the first output end of the trigger and generates an output signal QB, and the drain electrode of the NMOS transistor M72 serves as the second output end of the trigger and generates an output signal Q.

5. The high-speed low-power-consumption trigger as in claim 4, wherein the first enabling circuit comprises an AND gate AND1, an output end of the AND gate AND1 is connected to the gate electrode of the NMOS transistor M42, the second enabling circuit comprises an AND gate AND2, and an output end of the AND gate AND2 is connected to the gate electrode of the NMOS transistor M72.

* * * * *